United States Patent
Fujishima et al.

(10) Patent No.: US 10,544,032 B2
(45) Date of Patent: Jan. 28, 2020

(54) MEMS DEVICE

(71) Applicants: Masayuki Fujishima, Kanagawa (JP); Hidetaka Noguchi, Hyogo (JP); Hidenori Kato, Hyogo (JP); Junichi Azumi, Miyagi (JP); Masashi Suematsu, Hyogo (JP); Shuichi Suzuki, Osaka (JP)

(72) Inventors: Masayuki Fujishima, Kanagawa (JP); Hidetaka Noguchi, Hyogo (JP); Hidenori Kato, Hyogo (JP); Junichi Azumi, Miyagi (JP); Masashi Suematsu, Hyogo (JP); Shuichi Suzuki, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 198 days.

(21) Appl. No.: 15/879,511

(22) Filed: Jan. 25, 2018

(65) Prior Publication Data
US 2018/0215608 A1    Aug. 2, 2018

(30) Foreign Application Priority Data

Jan. 31, 2017    (JP) ................................. 2017-015925

(51) Int. Cl.
*B81B 3/00* (2006.01)
*G02B 26/08* (2006.01)

(52) U.S. Cl.
CPC ........ *B81B 3/0083* (2013.01); *G02B 26/0841* (2013.01); *G02B 26/0858* (2013.01); *B81B 2201/045* (2013.01)

(58) Field of Classification Search
CPC ............ B81B 3/0083; B81B 2201/045; B81B 2201/04; B81B 2201/047; B81B 7/008; H03H 2007/006; H03H 2007/008; H03H 2009/155; H03H 2009/241; H03H 2003/027; G02B 26/0858; G02B 26/0841
See application file for complete search history.

(56) References Cited

U.S. PATENT DOCUMENTS

| 9,696,157 B2* | 7/2017 | Falorni ............... G01C 19/5712 |
| 2004/0036942 A1* | 2/2004 | Abu-Ageel ............ H02N 1/002 359/237 |
| 2007/0019277 A1* | 1/2007 | Yeo ..................... G02B 26/0808 359/291 |

(Continued)

FOREIGN PATENT DOCUMENTS

| JP | 2005-195721 | 7/2005 |
| WO | WO96/041217 A1 | 12/1996 |
| WO | WO2004/003622 A1 | 1/2004 |

*Primary Examiner* — J. San Martin
(74) *Attorney, Agent, or Firm* — Oblon, McClelland, Maier & Neustadt, L.L.P.

(57) ABSTRACT

A MEMS device includes a plurality of ribbon elements, a securing portion, and a plurality of connecting portions. The securing portion supports the plurality of ribbon elements. The plurality of connecting portions are disposed on ends of each of the plurality of ribbon elements and connect each of the plurality of ribbon elements to the securing portion. An angle formed by a longitudinal extending line of each of the plurality of ribbon elements and each of the plurality of connecting portions is greater than 0° in a planar direction of each of the plurality of ribbon elements.

9 Claims, 6 Drawing Sheets

(56) References Cited

U.S. PATENT DOCUMENTS

| | | | |
|---|---|---|---|
| 2007/0080473 A1* | 4/2007 | Jang | B81B 3/0072 |
| | | | 264/1.9 |
| 2007/0146859 A1* | 6/2007 | Yang | B81C 1/00793 |
| | | | 359/237 |
| 2008/0297903 A1* | 12/2008 | An | G02B 26/0858 |
| | | | 359/579 |
| 2017/0350759 A1 | 12/2017 | Azumi et al. | |

* cited by examiner

MEMS DEVICE

CROSS-REFERENCE TO RELATED APPLICATION

This patent application is based on and claims priority pursuant to 35 U.S.C. § 119(a) to Japanese Patent Application No. 2017-015925, filed on Jan. 31, 2017, in the Japan Patent Office, the entire disclosure of which is incorporated by reference herein.

BACKGROUND

Technical Field

Aspects of the present disclosure relate to a micro electro mechanical systems (MEMS) device.

Related Art

Along with the development of microscopic technology, MEMS devices and compact machines incorporating the MEMS devices have received attention. As an MEMS device, for example, an optical modulator referred to as a grating light valve (GLV; registered trademark) is known.

The GLV has a structure in which a plurality of elastic ribbon-shaped elements (ribbon elements) having mirror-processed surfaces are one-dimensionally arranged. A voltage is applied to a portion between each ribbon element and a substrate including an electrode facing the ribbon element to exert electrostatic attraction, thus displacing the ribbon element to be attracted toward the substrate. The GLV is applied to, for example, an image display apparatus, such as a small-sized projector, and is known to be applicable to two-dimensional image generation using optical scanning means, such as a rotating mirror, based on the light from the GLV.

The MEMS device (hereinafter also referred to as a MEMS ribbon device) having a plurality of ribbon elements, such as GLV, displaces the plurality of ribbon elements to allow the one-dimensionally arranged ribbon elements to function as a diffraction grating to modulate the diffracted light. In an optical modulator including such a MEMS ribbon device, one ribbon element has a very small size of several micrometers×several tens to several hundreds of micrometers and can be driven at high speed.

Conventionally, the amount of displacement of the MEMS ribbon device in the height direction is controlled based on binary values corresponding to a case where the driving force is not applied to a ribbon element and a case where the driving force is applied to the ribbon element.

Moreover, there is proposed a modulator as an optical modulator operable alone or in combination with another modulator, for example, and having a structure in which ribbon elements are divided into two groups, and having a means for independently changing the heights of the ribbon elements.

Meanwhile, there has been a trend, in recent years, of bringing MEMS ribbon devices to new applications, such as optical switches and spectroscopes. In bringing MEMS ribbon devices to new applications, there have been researched multi-valued control of stopping a ribbon element with any displacement amount.

SUMMARY

In an aspect of the present disclosure, there is provided a MEMS device that includes a plurality of ribbon elements, a securing portion, and a plurality of connecting portions. The securing portion supports the plurality of ribbon elements. The plurality of connecting portions are disposed on ends of each of the plurality of ribbon elements and connect each of the plurality of ribbon elements to the securing portion. An angle formed by a longitudinal extending line of each of the plurality of ribbon elements and each of the plurality of connecting portions is greater than 0° in a planar direction of each of the plurality of ribbon elements.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

A detailed description is provided of configurations according to embodiments of FIG. 1 through FIG. 13 of the present disclosure.

First Embodiment

A MEMS device (MEMS ribbon device 10) according to a first embodiment of the present disclosure includes a plurality of ribbon elements (ribbon elements 11), a securing portion (securing portion 13) to support the plurality of ribbon elements, and connecting portions (connecting portions 12) positioned on both ends of each of the ribbon elements to connect each ribbon element and the securing portion. An angle formed by a longitudinal extending line of a ribbon element and each connecting portion is greater than 0° in a planar direction of the ribbon element. Note that the above-described components enclosed by the parentheses indicate reference numerals and application examples in the present embodiment.

Figure 1:
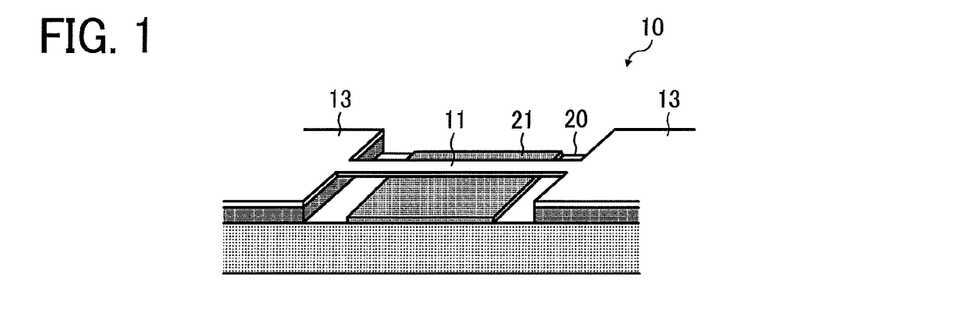
FIG. 1 is a perspective view of an example of a basic configuration of a MEMS ribbon device.

First, an example of a basic configuration of the MEMS ribbon device and the spectral performance of the MEMS ribbon device are described. FIG. 1 is a perspective view of an example of a basic configuration of the MEMS ribbon device 10.

The ribbon element 11 is a fine structural body, such as a silicon nitride film, and has functions of both a reflection plate and an electrode. The ribbon element 11 has opposed ends supported by the securing portion 13 and is stretched over an electrode 21 (common electrode) provided on a substrate 20. Application of a voltage between the ribbon element 11 and the substrate 20 including the electrode 21 allows the ribbon element 11 to bend toward the substrate 20 due to static electricity. In a state where no voltage is applied, the ribbon element 11 returns to the original state by high tension inherent to the silicon nitride film.

Although FIG. 1 illustrates one ribbon element 11, the MEMS ribbon device 10 according to the present embodiment described below includes a plurality of ribbon elements 11. In the case of aiming at obtaining a spectroscopic function in application of the MEMS ribbon device 10 to, for example, a spectroscopic sensor or an optical switch, it may be difficult to obtain the spectroscopic function simply by vertically moving a single ribbon element 11 since this would merely cause the light to be reflected and scattered on the surface of the ribbon element 11. Therefore, the MEMS ribbon device 10 according to the present embodiment includes the plurality of ribbon elements 11.

Figure 2:
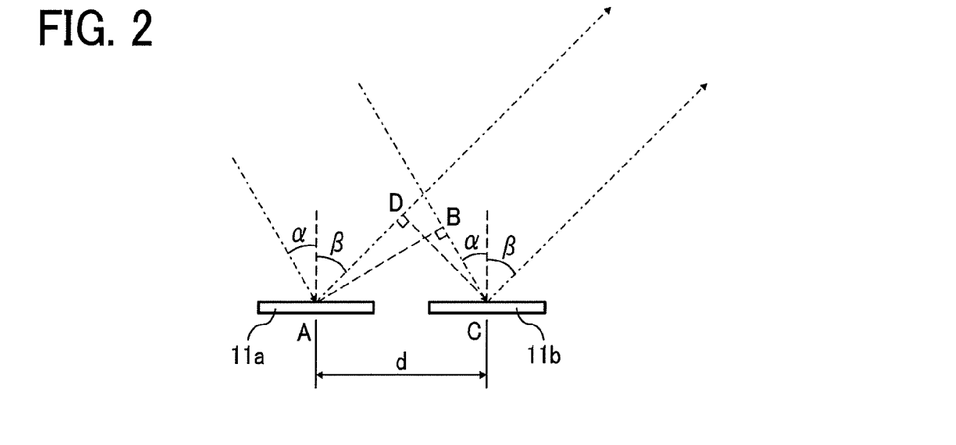
FIG. 2 is an illustration of a spectroscopic function of a MEMS ribbon device.

The spectroscopic function in the case where the plurality of ribbon elements 11 (defined as ribbon elements 11a and 11b) are provided will be described with reference to FIGS. 2, 3A and 3B. An angle $\alpha$ illustrated in FIG. 2 is an angle (incident angle) between the incident light and a diffraction grating normal (normal to the ribbon element). An angle $\beta$ is an angle (diffraction angle) between the diffracted light and the diffraction grating normal.

In this case, since an optical path difference (BC−AD) exists in the light reflected by the adjacent ribbon elements 11a and 11b, the diffraction angle having maximum reflection intensity changes for each of wavelengths. The diffraction grating equation at this time can be expressed by the following Formula (1), and a wavelength $\lambda$ satisfying Formula (1) is detected in the angle $\beta$ direction. In Formula (1), m is an integer.

$$d(\sin \alpha - \sin \beta) = m\lambda \quad (1)$$

Displacing the ribbon elements 11a and 11b in the vertical direction continuously changes the optical path difference. As illustrated in FIGS. 3A and 3B, with the arrangement of a detector 30 at a position where a predetermined diffraction angle is formed, the wavelength of the light detected in conjunction with the vertical displacement of the ribbon elements 11a and 11b would change, thus allowing the spectroscopic function to be obtained.

The diffraction grating equation at this time can be expressed by the following Formula (2). In Formula (2), in is an integer, and z is the displacement amount of the diffraction grating.

$$d(\sin \alpha - \sin \beta) + z(\cos \alpha + \cos \beta) = m\lambda \quad (2)$$

Figure 3A:
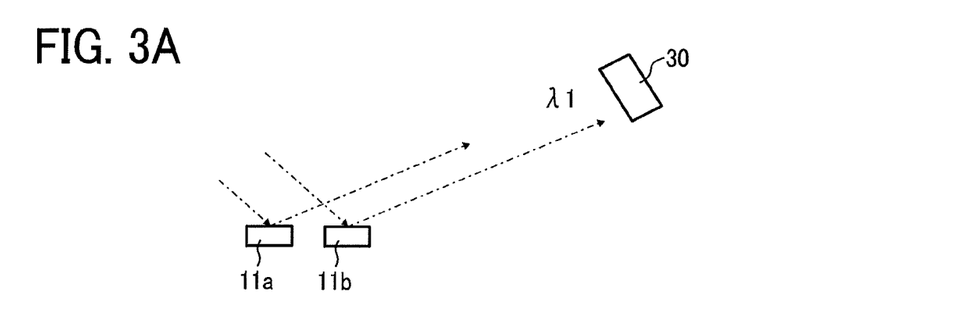
FIGS. 3A and 3B are illustrations of a spectroscopic function of a MEMS ribbon device.
Figure 3B:
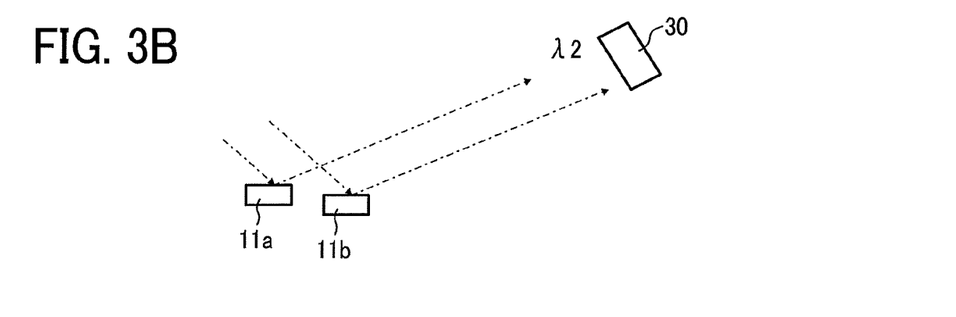

That is, a spectroscopic sensor can be obtained that is capable of detecting at the detector 30 light having a wavelength $\lambda 1 = d(\sin \alpha - \sin \beta)/m$ from the above-described Formula (1) in the example of FIG. 3A and capable of detecting, with the detector 30, light having a wavelength of $\lambda 2 = d(\sin \alpha - \sin \beta) + z(\cos \alpha + \cos \beta)/m$ from the above-described Formula (2) in the example of FIG. 3B with a displacement amount z. According to a similar principle, it is also possible to orient light of a specific wavelength. For the reasons described above, the MEMS ribbon device 10 according to the present embodiment includes the plurality of ribbon elements 11.

Figure 4A:
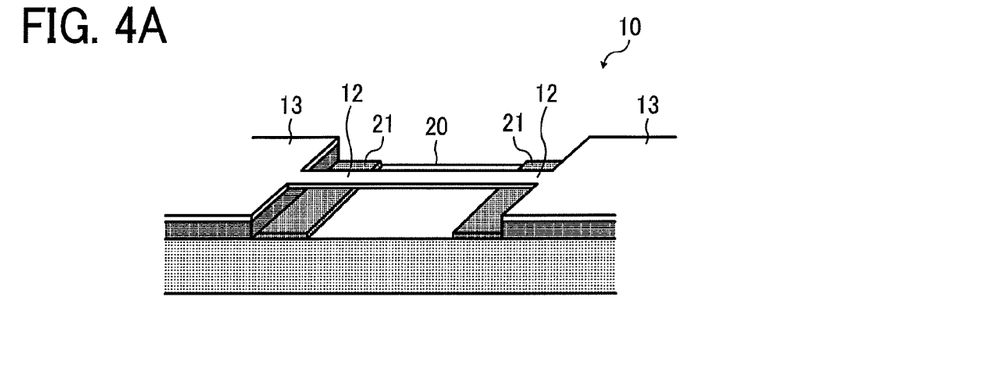
FIGS. 4A and 4B are a perspective view and a top view, respectively, of an example of a presupposed configuration of a MEMS ribbon device according to an embodiment of the present disclosure.
Figure 4B:
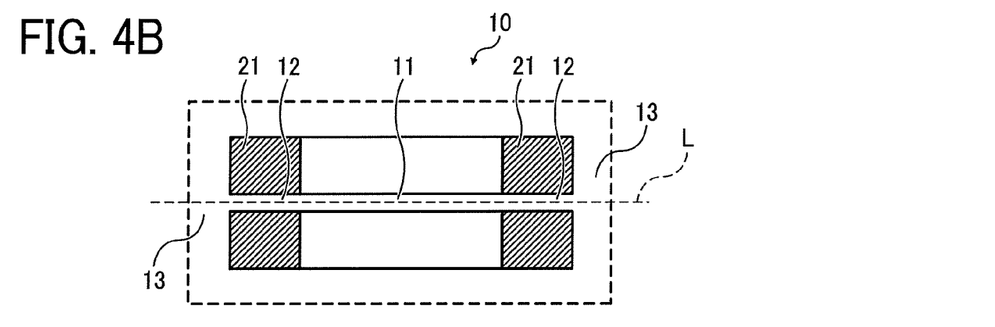

FIGS. 4A and 4B are views of an example of a presupposed configuration of the MEMS ribbon device 10 according to the first embodiment. Specifically, FIG. 4A is a perspective view of the MEMS ribbon device 10 and FIG. 4B is a top view of the MEMS ribbon device 10 illustrated in FIG. 4A.

As illustrated in FIG. 1, arranging the electrode 21 directly below the ribbon element 11 would generate a distributed load directly on the ribbon element 11, and thus, even with a configuration in which the connecting portion 12 is angled as described below, it is difficult to reduce the deflection of the ribbon element 11. By contrast, the MEMS ribbon device 10 according to the first embodiment has a configuration as illustrated in FIGS. 4A and 4B. In this configuration, when portions located at both end sides of the ribbon element 11 and connecting the ribbon element 11 with the securing portion 13 are configured to be the connecting portions 12. The electrode 21 is not disposed directly below the ribbon element 11 and instead, the electrode 21 is disposed directly below the connecting portion 12. In the case where the MEMS ribbon device 10 is driven by electrostatic attraction as in the present embodiment, the ribbon element 11 and the connecting portions 12 can be formed with a single layer structure of a same material. Such a configuration allows a region directly below which the electrode 21 is disposed and a region directly below which the electrode 21 is not disposed to be allocated to the connecting portion 12 and the ribbon element 11, respectively, distinguishably from each other.

In the MEMS ribbon device 10 illustrated in FIGS. 4A and 4B, when the ribbon element 11 is displaced in the vertical direction, a bending moment of the ribbon element 11 in a longitudinal direction (indicated by dotted line L in FIG. 4B) acting on the ribbon element 11 changes along the angle formed by the longitudinal extending line of the ribbon element 11 and the connecting portion 12 with respect to the bending moment acting on the connecting portion 12. The angle formed between the longitudinal extending line of the ribbon element 11 and the connecting portion 12 is defined as θ. The angle θ in FIGS. 4A and 4B is 0°.

Figure 5:
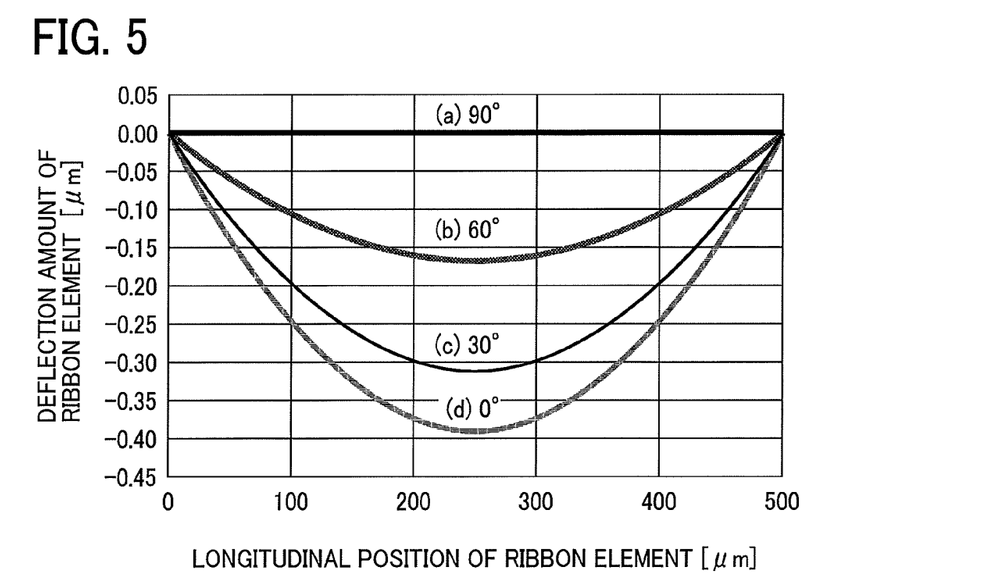
FIG. 5 is a graph of an example of a relationship between an angle formed by a longitudinal extending line of a ribbon element and a connecting portion, and a deflection amount of the ribbon element.
Figure 6A:
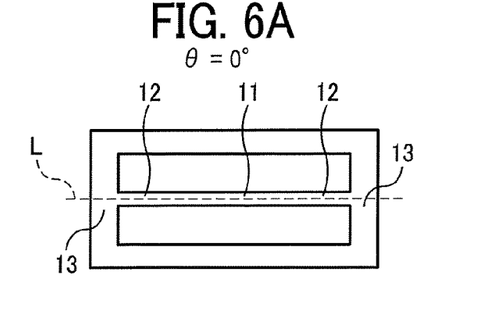
FIGS. 6A to 6G are top views of the MEMS ribbon device corresponding to respective angles illustrated in FIG. 5.
Figure 6B:
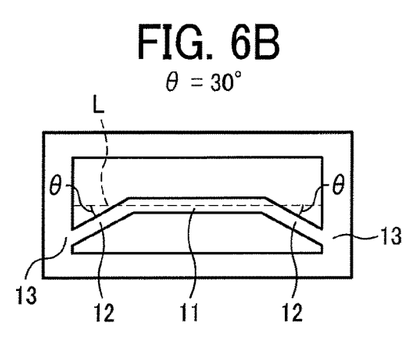
Figure 6C:
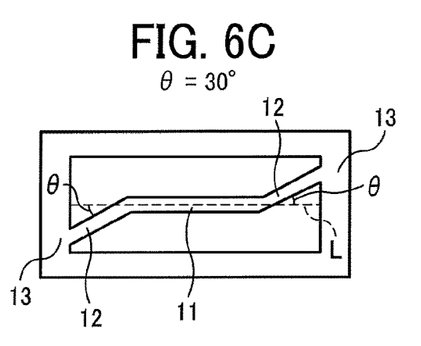
Figure 6D:
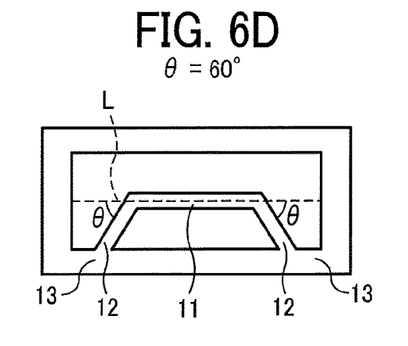
Figure 6E:
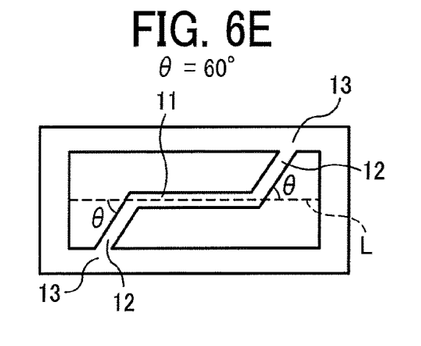
Figure 6F:
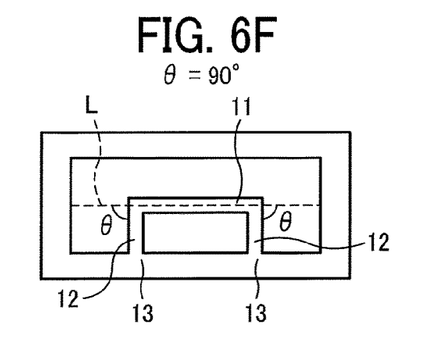
Figure 6G:
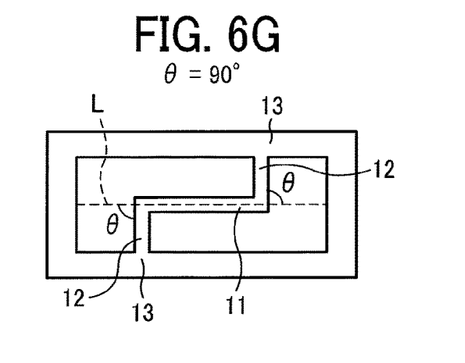

FIG. 5 is a graph of an example of a relationship between the angle θ formed by the longitudinal extending line of the ribbon element 11 and the connecting portion 12, and the deflection amount of the ribbon element 11, where (a) θ=0°, (b) θ=30°, (c) θ=60°, and (d) θ=90°. FIGS. 6A to 6G are top views of the MEMS ribbon device 10 corresponding to the angles θ illustrated in FIG. 5. The illustration of the electrode 21 in FIGS. 6A to 6G is omitted.

As illustrated in FIG. 5, the deflection amount of the ribbon element 11 is maximized when the angle θ formed by the longitudinal extending line of the ribbon element 11 and the connecting portion 12 is 0°. The deflection amount of the ribbon element 11 decreases as the angle θ formed by the longitudinal extending line of the ribbon element and the connecting portion 12 approaches 90°. The deflection amount of the ribbon element 11 is minimized when the ribbon element 11 and the connecting portion 12 are orthogonal to each other.

On the basis of this result, the MEMS ribbon device 10 according to the present embodiment is intended to set the angle θ formed between the longitudinal extending line of the ribbon element 11 and the connecting portion 12 to a value at least greater than 0° (θ>0°) to reduce the deflection of the ribbon element 11. It is more preferable that the angle θ formed between the longitudinal extending line of the ribbon element 11 and the connecting portion 12 is close to 90°, and the angle θ is most preferably 90°. Note that, although each of FIGS. 6A to 6E illustrates an exemplary case where the angle θ is an acute angle, the angle θ may be an obtuse angle (90°<θ<180°).

Figure 7:
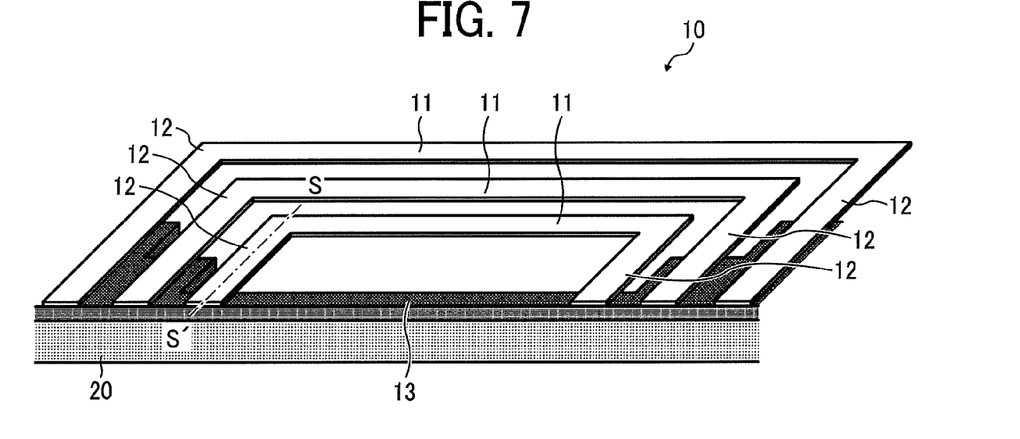
FIG. 7 is a schematic view of the MEMS ribbon device according to an embodiment of the present disclosure.
Figure 8:
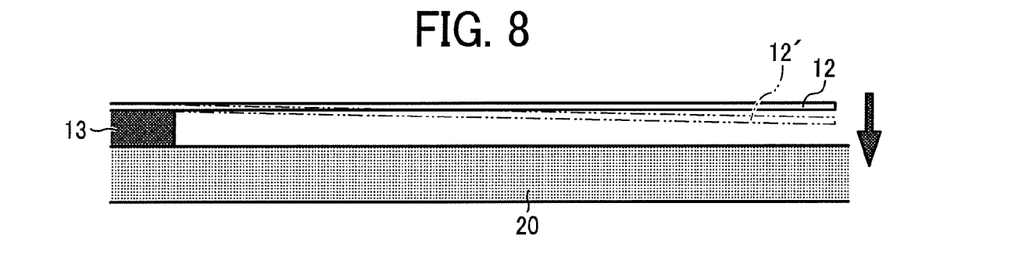
FIG. 8 is a cross-sectional view of the MEMS ribbon device taken along line S-S' in FIG. 7.
Figure 9:
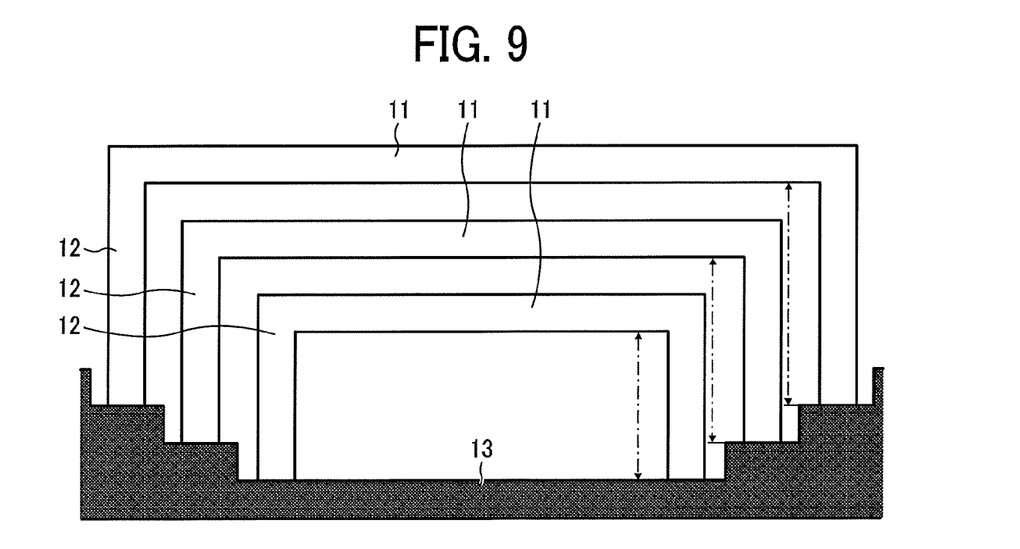
FIG. 9 is a view of the MEMS ribbon device of FIG. 7 as viewed from a substrate side.

FIG. 7 is a schematic view of the MEMS ribbon device 10 according to an embodiment (first embodiment) of the present disclosure. FIG. 8 is a cross-sectional view of the MEMS ribbon device 10 taken along line S-S' in FIG. 7. Herein, illustration of the electrode 21 provided on the substrate 20 is omitted. FIG. 9 illustrates the MEMS ribbon device 10 as viewed from the substrate side.

The MEMS ribbon device 10 according to the first embodiment includes the plurality of ribbon elements 11, the securing portion 13 to support both ends of each of the ribbon elements 11, and the connecting portions 12 connecting each of the ribbon elements 11 and the securing portion 13. In the present embodiment, an exemplary case of the three ribbon elements 11 is illustrate. Note that the number of the ribbon elements 11 is not limited to three and may be any suitable number of two or greater.

The MEMS ribbon device 10 sets the angle formed between the longitudinal extending line of each ribbon element 11 and the connecting portion 12 to 90° to reduce the bending moment of the ribbon element 11 in the longitudinal direction L acting on the ribbon element 11 so as to suppress deflection deformation of the ribbon element 11. While FIG. 7 is an exemplary case where the angle formed by the connecting portion 12 and the longitudinal extending line of the ribbon element 11 is 90°, the angle may be any angle as long as it is at least greater than 0° as described above.

In a case where the length of the connecting portion 12 is not uniform in the individual ribbon elements 11, this would make the relationship between the displacement amount and the driving force different between the individual ribbon elements 11. Therefore, in order to obtain a desired displacement amount and behavior at each of the ribbon elements 11, there would be a need to provide an independent input signal to each of the ribbon elements 11, leading to complicated control.

To avoid this, it is preferable to equalize the length of the connecting portion 12 of each ribbon element 11. In the present embodiment, in order to equalize the length of the connecting portion 12 of each ribbon element 11, the positions at which the connecting portions 12 are supported by the securing portion 13 are configured to be different from each other. That is, the securing portion 13 has a shape with steps to adjust the amount of protrusion toward the ribbon elements 11.

The shape of the securing portion 13 having steps, for example, as illustrated in FIG. 9, can equalize lengths l of the connecting portions 12. Such a configuration can equalize the relationship between the displacement amount and the driving force of the ribbon element 11 in all the ribbon elements 11, thus simplifying the control.

In the MEMS ribbon device 10 illustrated in FIG. 7, with the application of a voltage between the connecting portion 12 and the electrode 21 provided on the substrate 20, the connecting portion 12 is displaced toward the substrate 20 by electrostatic attraction, as illustrated by a shift from reference numerals 12 to 12' in FIG. 8, for example. At this time, the electrostatic attractive force acting on the connecting portion 12 is expressed by the following Formula (3) (Expression 1).

Expression 1

$$F = \frac{1}{2}\varepsilon_0 \frac{S}{(g-z)^2} V^2 \quad (3)$$

Herein, $\varepsilon_0$ is a dielectric constant of vacuum, S is the electrode area, g is an initial gap between the connecting portion 12 and the electrode 21 provided on the substrate 20, z is a displacement amount at the tip of the connecting portion 12 on the ribbon element 11 side, and V is a voltage.

The spring restoring force of the connecting portion 12 is expressed by the following Formula (4) (Expression 2).

Expression 2

$$F = \frac{Ewt^3}{4l^3} z \quad (4)$$

Herein, F is the Young's modulus of the connecting portion 12, w is a width of the connecting portion 12, t is a thickness of the connecting portion 12, and l is a length of the connecting portion 12.

From the proportion of Formulas (3) and (4), the relationship between the displacement amount z on the ribbon element 11 side of the connecting portion 12 and the voltage V is determined. For example, when the dimensions of the connecting portion 12 are w=20 μm, t=1 μm, l=1000 μm, and the material of the connecting portion 12 is silicon, a displacement of about 2.5 μm can be obtained with a voltage of 20V.

In the conventional MEMS ribbon device controlled with binary values, application of a driving force brings the ribbon element into contact with the surface facing the ribbon element to maintain the flatness of the ribbon in typical cases. However, in a case of controlling the displacement amount of the MEMS ribbon device in the height direction with multiple values, it is difficult to bring the ribbon element into contact with the facing surface, leading to the occurrence of deflection in the ribbon element.

The occurrence of deflection in the ribbon element makes the height different between both ends of the ribbon element and in the vicinity of the center, hindering uniformity in the characteristic of the emitted light, leading to increased noise light included in the emitted light (emission light noise).

Hence, the MEMS ribbon device 10 according to the first embodiment described above can reduce the deflection of the ribbon element 11 and suppress the noise light mixed with the emitted light. Moreover, the lengths of the connecting portions 12 can be equalized in all the ribbon elements 11, thus avoiding complicating control of the ribbon element 11.

While the first embodiment is an exemplary case where the connecting portion 12 and the ribbon element 11 are substantially on a same level, application is also possible to the MEMS ribbon device having a configuration in which the portion of the connecting portion 12 directly below which the electrode 21 is provided is raised relative to the securing portion 13 (shape in which the connecting portion 12 at both ends is raised and a zone including the ribbon element 11 is projecting).

Second Embodiment

Hereinafter, the MEMS ribbon device according to another embodiment of the present disclosure is described. Descriptions common to the above-described embodiment are omitted as appropriate.

Figure 10:
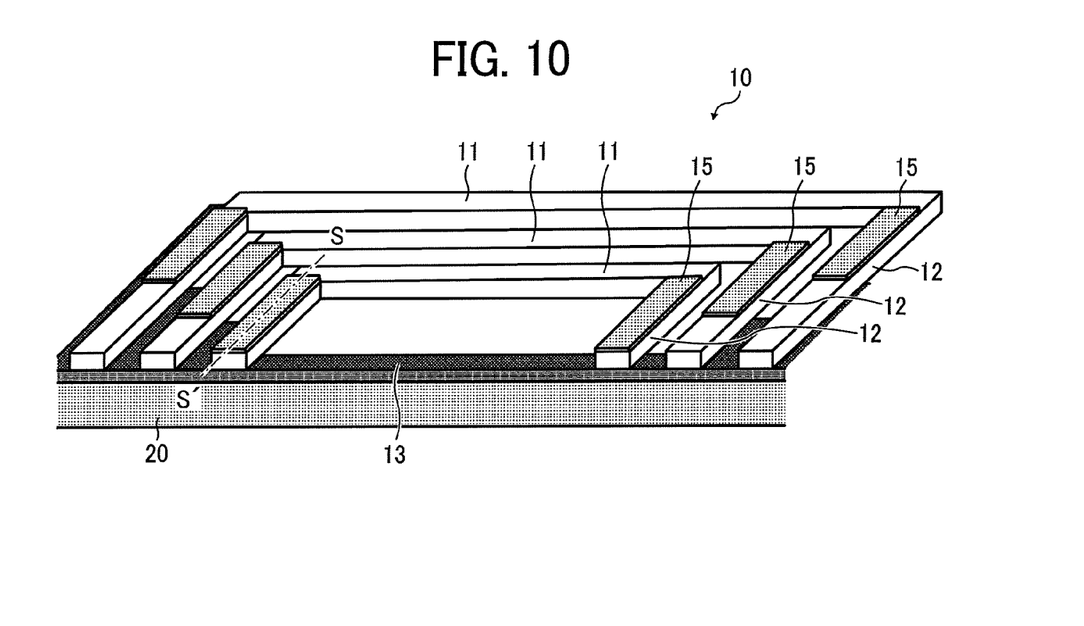
FIG. 10 is a schematic view of the MEMS ribbon device according to another embodiment of the present disclosure.
Figure 11:
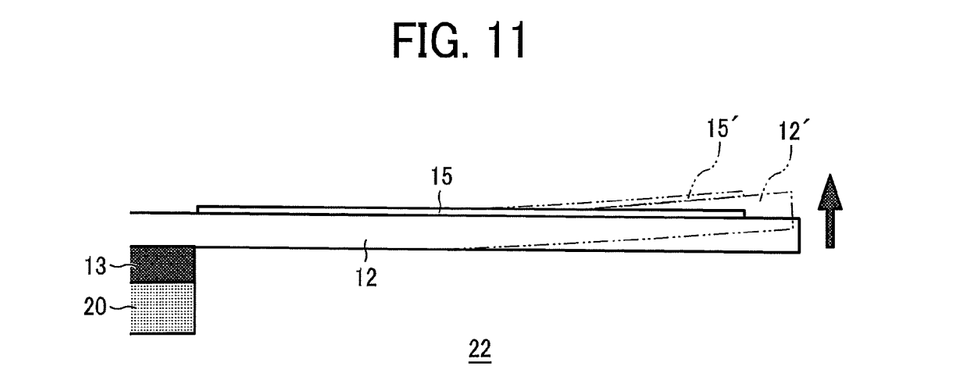
FIG. 11 is a cross-sectional view of the MEMS ribbon device taken along line S-S' in FIG. 10.

FIG. 10 is a schematic view of the MEMS ribbon device according to another embodiment (second embodiment) of the present disclosure. FIG. 11 is a cross-sectional view of the MEMS ribbon device taken along line S-S' in FIG. 10.

In a case where the MEMS ribbon device is GLV, for example, the thickness of the ribbon element 11 is extremely thin as several hundreds of nanometers or less and the length of the ribbon element 11 is 500 μm or less. Accordingly, when the device is applied to a case where incident light having a spot diameter of about several millimeters is controlled by a single device, the quantity of emitted light might decrease to increase the noise light in some cases.

Hence, the MEMS ribbon device 10 according to the second embodiment includes the plurality of ribbon elements 11, the securing portion 13 that supports both ends of each of the ribbon elements 11, and the connecting portions 12 that connects each of the ribbon elements 11 and the securing portion 13, and a piezoelectric material 15 is film-formed on at least a portion of the surface of the connecting portion 12. While the examples of FIGS. 10 and 11 are cases where the piezoelectric material 15 is formed on an upper surface (surface opposite to the substrate 20) of the connecting portion 12, the formation range of the piezoelectric material 15 is not limited to these examples.

In the MEMS ribbon device 10 according to the second embodiment, when a voltage is applied to the piezoelectric material 15, the piezoelectric material 15 is deformed (as indicated by a shift from reference numerals 15 to 15' in FIG. 11). With this deformation, the connecting portion 12 is deflected so as to generate the displacement of the ribbon element 11 in the vertical direction as indicated by the shift from the reference numeral 12 to 12' in FIG. 11, in a state where no voltage is applied, the piezoelectric material 15 does not deform and the ribbon element 11 returns to a predetermined position.

In the MEMS ribbon device 10 illustrated in FIG. 10, with a piezoelectric constant d of the piezoelectric material 15, a displacement amount 3 is expressed by the following Formula (5) (Expression 3).

Expression 3

$$\delta = \frac{1}{64} \cdot \frac{d(t_p + t_c)t_p l^2 V}{(E_p I_p + E_c I_c)\left(\frac{1}{E_p w_p t_p} + \frac{1}{E_c w_c t_c}\right)} \quad (5)$$

Herein, the subscripts p and c indicate the piezoelectric material 15 and the connecting portion 12, respectively. Additionally, I represents a moment of inertia of area.

For example, in a case where the piezoelectric constant d is 165 m/V, the dimensions of the piezoelectric material 15 are w=10 μm, t=2 μm, l=1000 μm, the dimensions of the connecting portion 12 are w=20 μm, t=20 μm, l=1000 μm, and the material of the connecting portion 12 is silicon, it is possible to obtain a displacement of about 2.5 μm with a voltage of 20V. In a case where the piezoelectric material 15 is film-formed on the surface of the connecting portion 12 as described above, sufficient displacement can be obtained even with the increased thickness of each of the connecting portion 12 and the ribbon element 11. Such a configuration can increase the length of the ribbon element 11. For example, sufficient displacement can be obtained even with the thickness of several tens of micrometers in each of the connecting portion 12 and the ribbon element 11, and thus, the ribbon element 11 can be extended to the length of several millimeters.

With the MEMS ribbon device 10 according to the second embodiment described above, the piezoelectric material 15 is film-formed on the surface of the connecting portion 12 to displace the ribbon element 11 utilizing expansion and contraction of the piezoelectric material 15, making it possible to increase the thickness of the ribbon element 11, and thus to achieve the extended length of the ribbon element 11.

Moreover, unlike the example of the first embodiment, using the piezoelectric material 15 would eliminate the necessity of providing the electrode 21, thus allowing the opening 22 to be formed in the lower space of the ribbon element 11. This makes it possible to be applied not merely to the case using reflected light but also to the case of using transmitted light achieving the sufficient amount of emitted light.

In a case where the MEMS ribbon device 10 is driven by the electrostatic attractive force, the connecting portion 12 and the ribbon element 11 form a single-layer structure of the same material as described in the first embodiment. However, In the system in which the MEMS ribbon device 10 is driven using the piezoelectric material 15 as described in the second embodiment, the connecting portion 12 typically has a five-layer structure including an insulating film, an upper electrode, a piezoelectric material, a lower electrode, and a silicon layer in this order, and the ribbon element 11 typically has a three-layer structure including an insulating film, a reflecting film, and a silicon layer in this order. Similarly, in a method that drives the MEMS ribbon device 10 using a temperature change described below and a method that drives MEMS ribbon device 10 by generating an electromagnetic force, the connecting portion 12 and the ribbon element 11 typically have mutually different structures.

Third Embodiment

Figure 12:
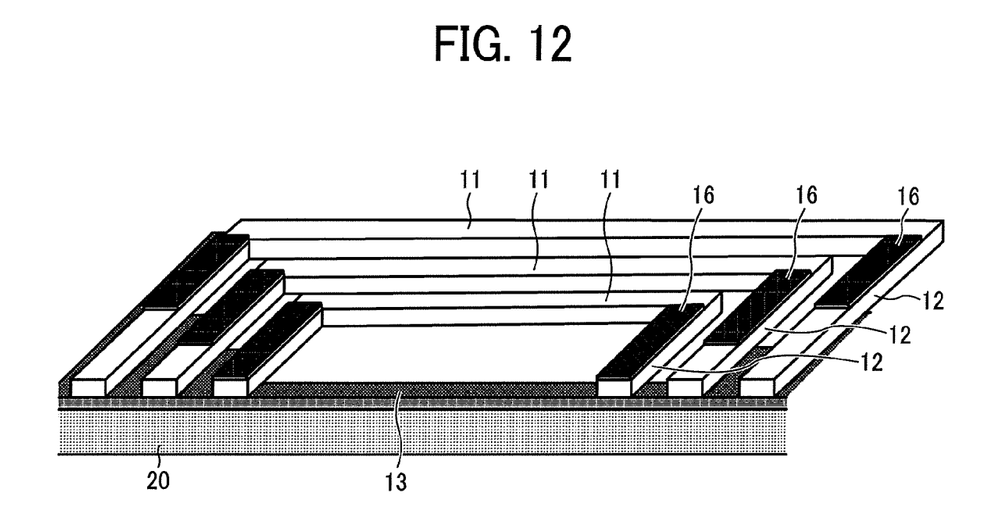
FIG. 12 is a schematic view of the MEMS ribbon device according to another embodiment of the present disclosure.

FIG. 12 is a schematic view of the MEMS ribbon device according to another embodiment (third embodiment) of the present disclosure.

The MEMS ribbon device 10 according to the third embodiment includes the plurality of ribbon elements 11, the securing portion 13 that supports both ends of each of the ribbon elements 11, and the connecting portions 12 that connect each of the ribbon elements 11 and the securing portion 13. Another material having a linear expansion coefficient different from a linear expansion coefficient of the connecting portion 12 is film-formed on at least a portion of the surface of the connecting portion 12. The material having a linear expansion coefficient different from a linear expansion coefficient of the connecting portion 12, which is to be film-formed on the surface of the connecting portion 12, is hereinafter referred to as a film formation material 16. While the example of FIG. 12 is an exemplary case where the film formation material 16 is formed on the upper surface (surface opposite to the substrate 20) of the connecting portion 12, the formation range of the film formation material 16 is not limited to this example.

In the MEMS ribbon device 10, the connecting portion 12 is deformed by using the expansion/contraction difference between the connecting portion 12 and the film formation material 16 due to the temperature change so as to generate displacement of the ribbon element 11 in the vertical direction. As the temperature change, for example, a temperature change due to energization heating can be used.

In the MEMS ribbon device 10 illustrated in FIG. 12, the displacement amount of the ribbon element 11 when the temperature is changed by ΔT is expressed by the following Formula (6) (Expression 4).

Expression 4

$$\delta = \frac{1}{64} \cdot \frac{(t_m + t_c) l^2 (\alpha_c - \alpha_m) \Delta T}{(E_m I_m + E_c I_c)\left(\frac{1}{E_m w_m t_m} + \frac{1}{E_c w_c t_c}\right)} \quad (6)$$

Herein, the subscripts m and c indicate the film formation material 16 and the connecting portion 12, respectively. Additionally, α is a linear expansion coefficient.

For example, in a case where the material of the connecting portion 12 is silicon and the film formation material 16 is aluminum, and when the dimensions of the film formation material 16 are w=10 μm, t=0.5 μm, l=1000 μm and the dimensions of the connecting portion 12 are w=20 μm, t=20 μm, l=1000 μm, a displacement of about 2.5 μm occurs with a change of 100° C. in temperature.

With the MEMS ribbon device 10 according to the third embodiment described above, a material having a linear expansion coefficient different from a linear expansion coefficient of the connecting portion 12 is film-formed on the surface of the connecting portion 12, and the expansion/contraction difference between the connecting portion 12 and the film formation material 16 due to the temperature change is utilized to enable displacement of the ribbon element 11.

Moreover, similarly to the second embodiment, using the film formation material 16 would also eliminate the necessity of providing the electrode 21, thus allowing an opening 22 to be formed in the lower space of the ribbon element 11. This makes it possible to be applied not merely to the case using reflected light but also to the case of using transmitted light, achieving the sufficient amount of emitted light.

Fourth Embodiment

Figure 13:
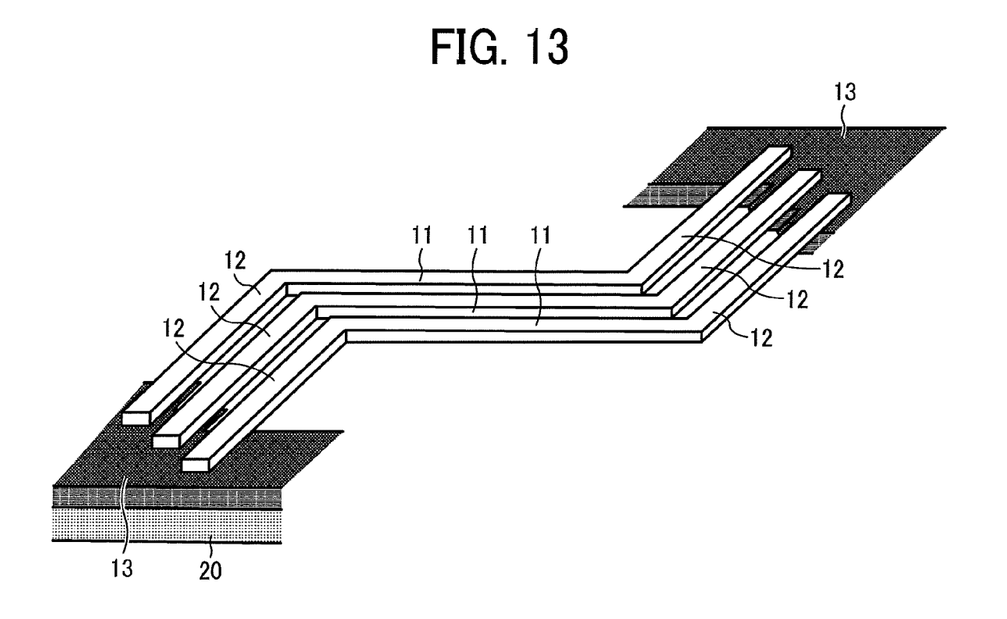
FIG. 13 is a schematic view of the MEMS ribbon device according to another embodiment of the present disclosure.

FIG. 13 is a schematic view of the MEMS ribbon device according to another embodiment (fourth embodiment) of the present disclosure.

In the first to third embodiments, the ribbon element 11 and the connecting portion 12 have a U-shaped configuration and are supported by the securing portion 13. Alternatively, it is also allowable to configure such that the ribbon elements 11 and the connecting portion 12 are connected to the securing portion 13 in a point-symmetrical positional relationship with respect to a center point of the ribbon element 11.

The MEMS ribbon device 10 according to the fourth embodiment includes the plurality of ribbon elements 11, the securing portions 13 that supports both ends of each of the ribbon elements 11, and the connecting portions 12 that connect each of the ribbon elements 11 and the securing portion 13. The connecting portions 12 at both ends of the ribbon element 11 are connected to the securing portions 13 on the opposite sides across the ribbon element 11.

The MEMS ribbon device 10 according to the fourth embodiment described above can equalize the lengths of the ribbon elements 11 as illustrated in FIG. 13. Such a configuration can equalize the resonance frequency in all the ribbon elements 11, thus allowing the simplification of the control.

The driving system of the ribbon element illustrated in FIG. 13 is not particularly limited, and it is allowable to use any of the system based on electrostatic attraction (first embodiment), the system using a piezoelectric material 15 (second embodiment), and the system using a material having different linear expansion coefficients (third embodiment).

Although the embodiments of the present disclosure have been described above, the present disclosure is not limited to the embodiments described above, and a variety of modifications can naturally be made within the scope of the present disclosure.

For example, while the above-described embodiments include, as a driving system of the ribbon element 11, the system based on electrostatic attraction (first embodiment), the system using the piezoelectric material 15 (second embodiment), and the system using a material having different linear expansion coefficient (third embodiment), the driving system is not limited to these, and other driving systems can also be used. For example, it is possible to use an electromagnetic driving system that drives the ribbon element 11, in which a permanent magnet is provided in the vicinity of the connecting portion 12, a coil is provided in a region including the surface of the connecting portion 12 excluding the surface of the ribbon element 11, and an electromagnetic force is generated by energization of the coil.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A MEMS device comprising:
   a plurality of ribbon elements;
   a securing portion to support the plurality of ribbon elements; and
   a plurality of connecting portions disposed on ends of each of the plurality of ribbon elements and connecting each of the plurality of ribbon elements with the securing portion,
   an angle formed by a longitudinal extending line of each of the plurality of ribbon elements and each of the plurality of connecting portions being greater than 0° in a planar direction of each of the plurality of ribbon elements.

2. The MEMS device according to claim 1,
   wherein the securing portion includes a step in a longitudinal direction of each of the plurality of connecting portions, and
   wherein lengths of the plurality of connecting portions are equal.

3. The MEMS device according to claim 1,
   wherein the angle formed by the longitudinal extending line of each of the plurality of ribbon elements and each of the plurality of connecting portions is 90°.

4. The MEMS device according to claim 1,
   wherein the plurality of connecting portions disposed on the ends of each of the plurality of ribbon elements are disposed point-symmetric with respect to a center point of each of the plurality of ribbon elements.

5. The MEMS device according to claim 4,
   wherein longitudinal lengths of the plurality of ribbon elements are equal.

6. The MEMS device according to claim 1, further comprising:
   a substrate; and
   a plurality of electrodes disposed on the substrate,
   wherein the plurality of connecting portions are opposed to the plurality of electrodes on the substrate.

7. The MEMS device according to claim 1, further comprising a piezoelectric material film-formed on at least a portion of the plurality of connecting portions.

8. The MEMS device according to claim 7,
   wherein an opening is disposed below the plurality of ribbon elements.

9. The MEMS device according to claim 1, further comprising a material film-formed on at least a portion of the plurality of connecting portions,
   wherein the material has a linear expansion coefficient different from a linear expansion coefficient of a material of the plurality of connecting portions.

* * * * *